US012592707B2

(12) United States Patent
Wang et al.

(10) Patent No.: US 12,592,707 B2
(45) Date of Patent: Mar. 31, 2026

(54) CIRCUITS FOR ONLINE ADAPTIVE DC OFFSET CORRECTION AND RECEIVERS

(71) Applicant: Chongqing GigaChip Technology Co., Ltd., Chongqing (CN)

(72) Inventors: Youhua Wang, Chongqing (CN); Fei Li, Chongqing (CN); Kairang Chen, Chongqing (CN); Dongbing Fu, Chongqing (CN); Can Zhu, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 111 days.

(21) Appl. No.: 18/531,629

(22) Filed: Dec. 6, 2023

(65) Prior Publication Data

US 2024/0106447 A1     Mar. 28, 2024

Related U.S. Application Data

(63) Continuation of application No. PCT/CN2021/107418, filed on Jul. 20, 2021.

(30) Foreign Application Priority Data

Jun. 18, 2021     (CN) .......................... 202110680221.8

(51) Int. Cl.
*H03M 1/06* (2006.01)
*H03M 1/10* (2006.01)
(Continued)

(52) U.S. Cl.
CPC ....... *H03M 1/0607* (2013.01); *H03M 1/1023* (2013.01); *H04B 1/16* (2013.01); *H04L 25/061* (2013.01)

(58) Field of Classification Search
CPC .... H04L 25/06; H04L 25/061; H03M 1/0607; H03M 1/1023; H03G 3/001; H04B 1/30
See application file for complete search history.

(56) References Cited

U.S. PATENT DOCUMENTS

2005/0058221 A1* 3/2005 Wetzker ................. H03D 3/008
375/316
2006/0217100 A1* 9/2006 Astrachan ................ H04B 1/30
455/296

(Continued)

FOREIGN PATENT DOCUMENTS

CN         102244523  A     11/2011
CN         109672461  A     4/2019

OTHER PUBLICATIONS

Kyung-wan Nam, Direct Down-Conversion System with I/Q Correction, TI Designs High Speed: CerTIfied™ Design, 2013, Texas Instruments Incorporated, Jul. 2013 (Year: 2013).*

(Continued)

*Primary Examiner* — Aristocratis Fotakis

(57)            ABSTRACT

Embodiments of the disclosure provide a circuit for online adaptive direct current offset correction, which includes: an analog adder circuit, a digital-to-analog conversion circuit, a direct current detection circuit, an adaptive update signal generating circuit, an output circuit, and a mode selection circuit. Embodiments of the present disclosure also provide a zero-IF receiver including a circuit for online adaptive DC offset correction.

14 Claims, 3 Drawing Sheets

(51) Int. Cl.
  *H04B 1/16*     (2006.01)
  *H04L 25/06*    (2006.01)

(56)                References Cited

U.S. PATENT DOCUMENTS

| | | | |
|---|---|---|---|
| 2007/0082643 A1* | 4/2007 | Golusky | H04L 25/063 |
| | | | 455/296 |
| 2009/0225911 A1* | 9/2009 | Elahi | H04B 1/30 |
| | | | 327/307 |
| 2009/0264090 A1* | 10/2009 | Ivonnet | H04L 25/06 |
| | | | 455/233.1 |
| 2010/0075624 A1* | 3/2010 | Shanan | H04L 25/06 |
| | | | 455/253.2 |
| 2012/0026039 A1* | 2/2012 | Ganeshan | G01S 19/37 |
| | | | 342/357.73 |
| 2014/0119418 A1* | 5/2014 | Noest | H04L 25/061 |
| | | | 375/319 |
| 2022/0103138 A1* | 3/2022 | Okuda | H03F 1/3264 |

OTHER PUBLICATIONS

Mohamed K. Nezami, Wireless Software Defined Receiver Front
End DC Offset Removal, 2002 (Year: 2002).*

* cited by examiner

| Polarity,update, minus,plus | A |
|---|---|
| 10xx | 10 |
| 1100 | 10 |
| 1101 | 01 |
| 1110 | 10 |
| 1111 | 11 |

| Polarity,update, minus,plus | A |
|---|---|
| 00xx | 10 |
| 0100 | 10 |
| 0101 | 10 |
| 0110 | 01 |
| 0111 | 11 |

CIRCUITS FOR ONLINE ADAPTIVE DC OFFSET CORRECTION AND RECEIVERS

CROSS-REFERENCE

This application is a continuation application of International Patent Application No. PCT/CN2021/107418, filed on Jul. 20, 2021, and claiming the priority to Chinese Application No. 202110680221.8 filed on Jun. 18, 2021, the contents of all of which are incorporated herein by reference in their entirety.

TECHNICAL FIELD

Embodiments of the present disclosure relate to the field of circuit correction, in particular to circuits for online adaptive DC offset correction and receivers including the same.

BACKGROUND

With the development of integrated circuits, the architecture of on-chip zero-IF receivers is becoming more and more widely used. In a zero-IF receiver, the RF signal undergoes a frequency conversion by a mixer to obtain an analog baseband signal. The analog baseband signal is filtered by a low-pass filter and then enters the ADC to realize the conversion from analog to digital. In a zero-IF receiver, due to factors such as local oscillator feedthrough and low-pass filter device offset, the output signal of the low-pass filter not only has useful AC signals but also has a certain amount of DC components. Due to the existence of the DC component, the dynamic range of the entire receiving channel is greatly reduced. When the gain of the RF front-end of the receiver is large, the DC component may even cause the ADC to enter a saturated state, thereby causing the entire receiving channel to work abnormally.

SUMMARY

Embodiments of the present disclosure provide circuits for online adaptive DC offset correction and receivers.

Embodiments of the present disclosure provide a circuit for online adaptive DC offset correction, which is applied to a zero-IF receiver. The circuit includes an analog adder circuit, an analog-to-digital conversion circuit, a DC detection circuit, an adaptive update signal generating circuit, an output circuit, and a mode selection circuit.

The analog adder circuit is configured to receive a first input signal generated by a zero-IF receiver and a second input signal generated by a digital-to-analog conversion circuit and generate a first output signal according to the first input signal and the second input signal.

The analog-to-digital conversion circuit is configured to receive the first output signal and perform analog-to-digital conversion on the first output signal to obtain a second output signal.

The DC detection circuit is configured to perform DC detection on the second output signal under the control of a detection control signal generated by an adaptive update signal generating circuit to generate a detection result.

The adaptive update signal generating circuit is configured to receive the detection result and generate an update control signal according to the detection result.

The output circuit is configured to receive the update control signal and generate a first mode selection signal according to the update control signal.

The mode selection circuit is configured to receive the first mode selection signal and generate a correction signal according to the first mode selection signal and a second mode selection signal, wherein the correction signal is used as an input signal of the digital-to-analog conversion circuit.

In some exemplary embodiments, the DC detection circuit includes a delay sub-circuit, a digital adder sub-circuit, a divider sub-circuit, and an accumulator sub-circuit.

The delay sub-circuit is configured to receive the second output signal and perform delay processing on the second output signal to generate a delayed signal.

The digital adder sub-circuit is configured to receive the delay signal and perform an addition operation on the second output signal and an output signal of the delay sub-circuit to generate an addition signal.

The divider sub-circuit is configured to receive the addition signal and perform division operation on the addition signal.

The accumulator sub-circuit is configured to receive the division signal and the update control signal and generate a detection result according to the division signal and the update control signal.

In some exemplary embodiments, the delay sub-circuit includes a plurality of delay elements connected in sequence.

In some exemplary embodiments, the accumulator sub-circuit includes an adder element and a unit delay element. The adder element includes a first input end and a second input end. The first input end is connected to an output end of the divider sub-circuit. The second input end is connected to the output end of the unit delay element. An output end of the adder element is connected to an input of the unit delay element.

In some exemplary embodiments, the DC detection circuit includes a reset circuit generating sub-circuit, a frequency division sub-circuit, an accumulator sub-circuit, a latch sub-circuit, and a divider sub-circuit.

In some exemplary embodiments, the reset circuit generating sub-circuit is configured to receive the detection control signal and generate a reset control signal according to the detection control signal.

In some exemplary embodiments, the frequency division sub-circuit is configured to receive the detection control signal and generate a high pulse signal according to the detection control signal.

In some exemplary embodiments, the accumulator sub-circuit is configured to receive the reset control signal and the second output signal and perform accumulation processing to generate an accumulation signal;

In some exemplary embodiments, the latch sub-circuit is configured to receive the high pulse signal and latch the accumulation signal based on the high pulse signal.

In some exemplary embodiments, the divider sub-circuit is configured to receive the high pulse signal and an output of the latch sub-circuit and perform a division operation to obtain the detection result.

In some exemplary embodiments, the accumulator sub-circuit includes an adder element and a unit delay element. The adder element includes a first input end and a second input end. The first input end is connected to an output end of the analog-to-digital conversion circuit. The second input end is connected to the output end of the unit delay element. The output end of the adder element is connected to the input end of the unit delay element.

In some exemplary embodiments, the update control signal includes a first control signal, a second control signal, and a third control signal.

In some exemplary embodiments, the adaptive update signal generating circuit includes a programmable timing sub-circuit, a latch sub-circuit with a setting function, and a comparator sub-circuit.

In some exemplary embodiments, the programmable timing sub-circuit is configured to generate a first control signal when timing exceeds a set threshold.

In some exemplary embodiments, the latch sub-circuit with a setting function is configured to receive the first control signal and latch the detection result according to the first control signal.

In some exemplary embodiments, the comparator sub-circuit is configured to receive the detection result and compare the detection result with a set threshold to generate a second control signal and a third control signal.

In some exemplary embodiments, the comparator sub-circuit is configured to generate a second control signal upon determining that the detection result exceeds a high threshold value and generate a third control signal upon determining that the detection result is lower than a low threshold value.

In some exemplary embodiments, the output circuit includes a decoder sub-circuit, a selection sub-circuit, and an accumulator sub-circuit.

In some exemplary embodiments, the decoder sub-circuit is configured to receive the update control signal and generate a selection control signal according to the update control signal.

In some exemplary embodiments, the selection sub-circuit is configured to receive the selection control signal and generate a selection signal according to the selection control signal.

In some exemplary embodiments, the accumulator sub-circuit is configured to accumulate the selection signal to generate the first mode selection signal.

In some exemplary embodiments, the accumulator sub-circuit includes an adder element and a unit delay element. The adder element includes a first input end and a second input end. The first input end first input end is connected to an output end of the selection sub-circuit. The second input end is connected to an output end of the unit delay element. The output end of the adder element is connected to the input end of the unit delay element.

Embodiments of the present disclosure also provide a zero-IF receiver, which includes the above-mentioned circuit for online adaptive DC offset correction.

As mentioned above, the circuit for online adaptive DC offset correction provided by embodiments of the present disclosure may have one or more of the following beneficial effects.

A circuit for online adaptive DC offset correction according to embodiments of the present disclosure, which is applied to a zero-IF receiver and includes: an analog adder circuit, an analog-to-digital conversion circuit, a DC detection circuit, an adaptive update signal generating circuit, an output circuit, and a mode selection circuit. The analog adder circuit is configured to receive a first input signal generated by a zero-IF receiver and a second input signal generated by a digital-to-analog conversion circuit and generate a first output signal according to the first input signal and the second input signal. The analog-to-digital conversion circuit is configured to receive the first output signal and perform analog-to-digital conversion on the first output signal to obtain a second output signal. The DC detection circuit is configured to perform DC detection on the second output signal under the control of a detection control signal generated by an adaptive update signal generating circuit to generate a detection result. The adaptive update signal generating circuit is configured to receive the detection result and generate an update control signal according to the detection result. The output circuit is configured to receive the update control signal and generate a first mode selection signal according to the update control signal. The mode selection circuit is configured to receive the first mode selection signal and generate a correction signal according to the first mode selection signal and a second mode selection signal, wherein the correction signal is used as an input signal of the digital-to-analog conversion circuit.

The circuit for online adaptive DC offset correction according to embodiments of the present disclosure may automatically detect the magnitude of the DC offset value in the input signal, and adaptively compensate the DC offset value, thereby eliminating the influence of the DC offset on the performance of the receiver. The circuit may adaptively change the adjustment rate during the compensation process, and perform DC compensation quickly in the case of a large offset and slowly update the DC value in the case of a small offset. Using this adaptive method, the correction circuit may achieve a fast convergence speed, and may also minimize the impact on the signal chain.

DETAILED DESCRIPTION

Figure 1:
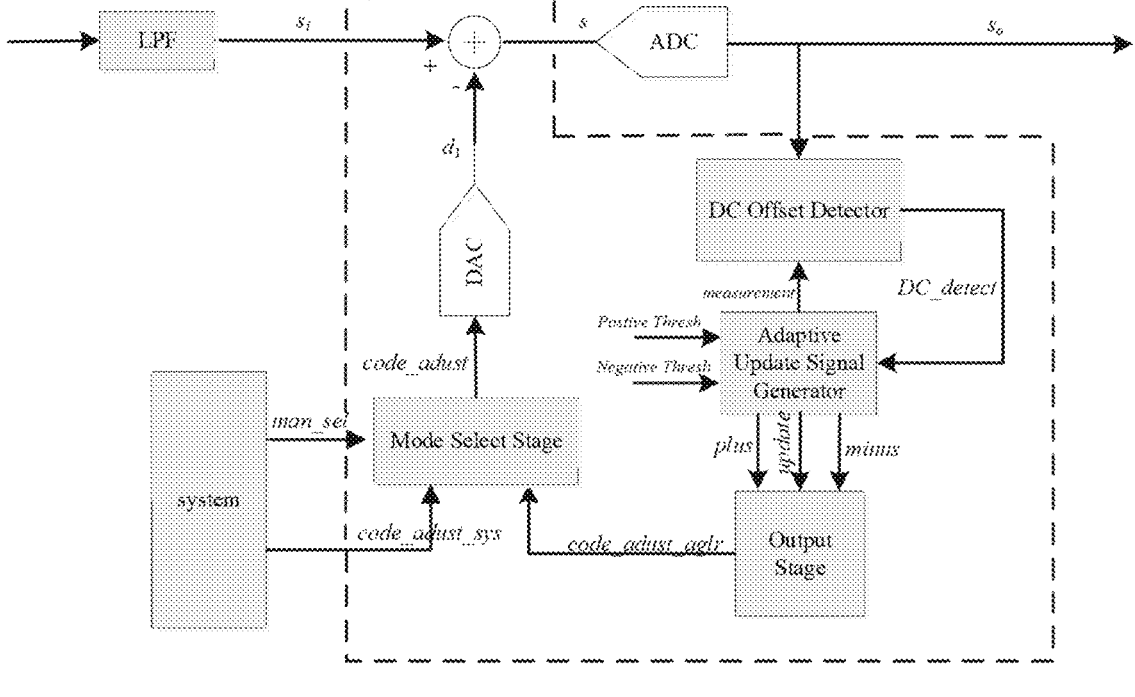
FIG. 1 is a functional block diagram of a circuit for online adaptive DC offset correction according to exemplary embodiments of the present disclosure.

Embodiments of the present disclosure are described below through specific examples, and those skilled in the art can easily understand other advantages and effects of the present disclosure from the content disclosed in this specification. The present disclosure can also be implemented or applied through other different specific implementation modes, and various modifications or changes can be made to the details in this specification based on different viewpoints and applications without departing from the present disclosure. It should be noted that, in the case of no conflict, the following embodiments and features in the embodiments can be combined with each other.

It should be noted that the figures provided in the following embodiments are only schematically illustrating the basic ideas of the present disclosure. Only the components related to the present disclosure are shown in the figures. The number, shape, and size of the components may not be shown as they are in actual implementation. During actual implementation, the type, quantity, and proportion of each component can be changed arbitrarily, and the layout of components may also be more complicated.

Traditional DC offset circuits/algorithms are usually divided into foreground correction algorithms and online correction algorithms. The foreground correction algorithm usually corrects the circuit when the circuit is turned off or when the receiving link is idle (TDD mode). This kind of correction method has high correction accuracy, but the correction circuit cannot perform correction during normal receiving work, which limits the use of the circuit. In addition, when the working environment changes, the performance of the foreground correction algorithm will decrease. Another correction method, i.e., online correction, overcomes the shortcomings of the working mode of the foreground correction and enables the algorithm to correct the DC offset while the algorithm is working normally. However, this method usually introduces an additional circuit on the main signal chain, which has a certain influence on the main signal channel during real-time correction.

In order to overcome the shortcomings of the above mentioned methods. Exemplary embodiments of the present disclosure propose a circuit for online adaptive DC offset correction. In some exemplary embodiments, the circuit includes an analog adder circuit, a digital-to-analog conversion circuit, a DC detection circuit, an adaptive update signal generating circuit, an output circuit, a mode selection circuit, and the like. In some exemplary embodiments, the circuit receives an input signal with a DC component, detects the DC component, obtains a compensation value through calculation, converts the compensation value into an analog signal, and feeds it back to the input terminal of the signal chain, thereby eliminating the DC component of the signal itself. During the compensation process, the circuit may adaptively adjust the rate of the compensation according to the DC offset value in the input signal. Thus, DC compensation may be performed quickly under the condition of a large DC offset, and DC value may be updated slowly in the situation of a small DC offset. Therefore, the circuit may achieve a fast convergence speed, and may also minimize the impact on the signal chain.

FIG. 1 is a functional block diagram of a circuit for online adaptive DC offset correction according to exemplary embodiments of the present disclosure. The circuit for online adaptive DC offset correction includes an analog adder circuit, an analog-to-digital conversion circuit, a DC detection circuit, an adaptive update signal generating circuit, an output circuit, and a mode selection circuit.

The analog adder circuit is configured to receive a first input signal generated by a zero-IF receiver and a second input signal generated by a digital-to-analog conversion circuit and generate a first output signal based on the first input signal and the second input signal.

The analog-to-digital conversion circuit is configured to receive the first output signal and perform analog-to-digital conversion on the first output signal to obtain a second output signal.

The DC detection circuit is configured to perform DC detection on the second output signal under the control of a detection control signal generated by an adaptive update signal generating circuit to generate a detection result.

The adaptive update signal generating circuit is configured to receive the detection result and generate an update control signal according to the detection result.

The output circuit is configured to receive the update control signal and generate a first mode selection signal according to the update control signal.

The mode selection circuit is configured to receive the first mode selection signal and generate a correction signal according to the first mode selection signal and a second mode selection signal, wherein the correction signal is used as an input signal of the digital-to-analog conversion circuit.

In FIG. 1, a low pass filter (LPF) and an analog-to-digital converter (ADC) are part of the signal chain of the wireless receiver.

It can be known from FIG. 1 that the circuit for DC offset correction has two input signals and one output signal. One of the two input signals is an analog input $s_i(t)$, which is output from a low-pass filter of a receiver, and the other of the two input signals is a digital input $s_o(n)$, which is output from an ADC of the receiver. The output signal of the circuit for DC offset correction is s(t), which is used as the input of the ADC. Due to factors such as receiver local oscillator leakage, the signal $s_i(t)$ contains a DC component $d_i$. The signal s(t) after DC offset correction is quantized by the receiver's ADC to obtain a digital output $s_o[n]$. Due to the existence of $d_i$, the performance of the receiver will be reduced, and even the receiver will be saturated.

In some exemplary embodiments, the analog adder circuit is an analog adder. In some exemplary embodiments, the analog adder circuit includes a positive input terminal, a negative input terminal, and an output terminal. An input signal $s_i$, that is, the first input signal is connected to the positive input terminal of the analog adder circuit, and an output electrical signal $d_i$ of the digital-to-analog converter (DAC), that is, the second input signal is connected to a negative input terminal of the analog adder circuit. An output signal s of the analog adder circuit, i.e., the first output signal is connected to an input terminal of the ADC. An output digital signal $s_o$ quantized by the ADC is the second output signal. On the one hand, the second output signal is output to the next stage of the receiver, and at the same time, the second output signal is also used as an input of a DC detection circuit (DC Offset Detector). The DC detection circuit performs DC detection on the second output signal $s_o$ under the control of the detection control signal measurement generated by the adaptive update signal generating circuit (i.e., Adaptive Update Signal Generator), generates a detection result DC_detect, and sends the detection result DC_detect to the adaptive update signal generating circuit. The adaptive update signal generating circuit generates an update control signal according to the detected detection result DC_detect (a DC value) and set thresholds Positive_Threshold and Negative_Threshold. In some exemplary embodiments, the update control signal includes a first control signal update, a second control signal plus, and a third control signal minus. The update control signal is used to control the output circuit (e.g., Output Stage). The output circuit generates, according to the update control signal, a first mode selection signal code_adust_algr as an input of the mode selection circuit (i.e., Mode Select Stage). Another input of the mode selection circuit is a second mode selection signal code_adust_sys generated by a system. Examples of the system include a central processing unit (referred to as CPU), application-specific integrated circuit (ASIC), digital signal processor (DSP), digital signal processing device (DSPD), programmable logic device (PLD), Field Programmable Gate Array (FPGA), etc. The mode selection circuit outputs the control signal code_adust of the DAC according to the first mode selection signal and the second mode selection signal and generates a corresponding DC value $d_1$ for eliminating the DC component in the input signal.

Let the input signal with DC component be:

$$s_i(t)=d_i+A \sin(2\pi f_{in}t) \tag{1}$$

wherein, $d_i$ is the DC component of the input signal, A is the amplitude of the input signal, $f_{in}$ is the frequency of the input signal, and the corresponding signal period is $T_{in}$.

Let the output analog number from the DAC under the control of the input control signal code_adust is $d_1$, then the output of the adder is:

$$s(t)=d_i-d_1+A\sin(2\pi f_{in}t) \qquad (2)$$

After the output signal s passes through the ADC, the conversion from the analog domain to the digital domain is realized. It is set that during the analog-to-digital conversion process, the sampling rate of the ADC is $f_s$, and the corresponding sampling period is $T_s$. It is set that within the processing time of the circuit, N sampling points are used to estimate the DC component. In order to accurately estimate the DC component in the signal, it is necessary to select an appropriate number of sampling points.

Figure 2:
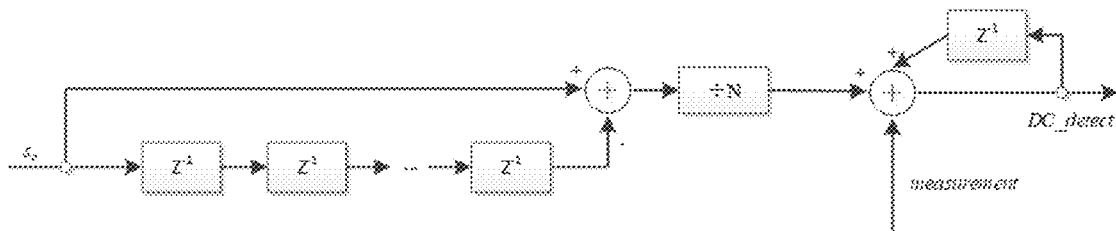
FIG. 2 is a circuit diagram of a DC detection circuit according to exemplary embodiments of the present disclosure.

In some exemplary embodiments, a circuit structure as shown in FIG. 2 is used to realize DC offset detection. The DC detection circuit shown in FIG. 2 includes a delay sub-circuit, a digital adder sub-circuit, a divider sub-circuit, and an accumulator sub-circuit.

In some exemplary embodiments, the delay sub-circuit is configured to receive a second output signal and perform delay processing on the second output signal to generate a delayed signal.

In some exemplary embodiments, the digital adder sub-circuit is configured to receive the delay signal and perform an addition operation on the second output signal and the output signal of the delay sub-circuit to generate an addition signal.

In some exemplary embodiments, the divider sub-circuit is configured to receive the addition signal and perform division operation on the addition signal.

In some exemplary embodiments, the accumulator sub-circuit is configured to receive the division signal and an update control signal and generate a detection result according to the division signal and the update control signal.

In some exemplary embodiments, the delay sub-circuit includes a plurality of delay elements connected in sequence.

The input signal $s_o$, on one hand, is sent to a positive input terminal of the digital adder sub-circuit, and on the other hand is also input to a negative input terminal of the digital adder sub-circuit after being delayed by N clock cycles by N delay elements. The positive input terminal of the digital adder sub-circuit is connected to a terminal of the input signal, and the negative input terminal of the digital adder sub-circuit is connected to an output terminal of the delay sub-circuit (that is, an output terminal of the last delay element). The output of the digital adder sub-circuit is connected to the divider sub-circuit to be divided by N. In the divider sub-circuit, N can be an integer power of 2, and the division operation can be realized by right shifting on the hardware, thereby reducing the hardware overhead. The output of the divider sub-circuit is sent to the input of the accumulator including the digital adder sub-circuit and a unit delay sub-circuit, and the accumulator sub-circuit also receives the detection control signal measurement. Under the control of the detection control signal measurement, the accumulator sub-circuit outputs the detection result DC_detect, which is the detection result DC_detect detected online in real-time.

In some exemplary embodiments, the accumulator sub-circuit includes an adder element and a unit delay element. The adder element includes a first input terminal and a second input terminal. The first input terminal is connected to the output terminal of the divider sub-circuit. The second input terminal is connected to the output terminal of the unit delay element, and the output terminal of the adder element is connected to the input terminal of the unit delay element.

Figure 3:
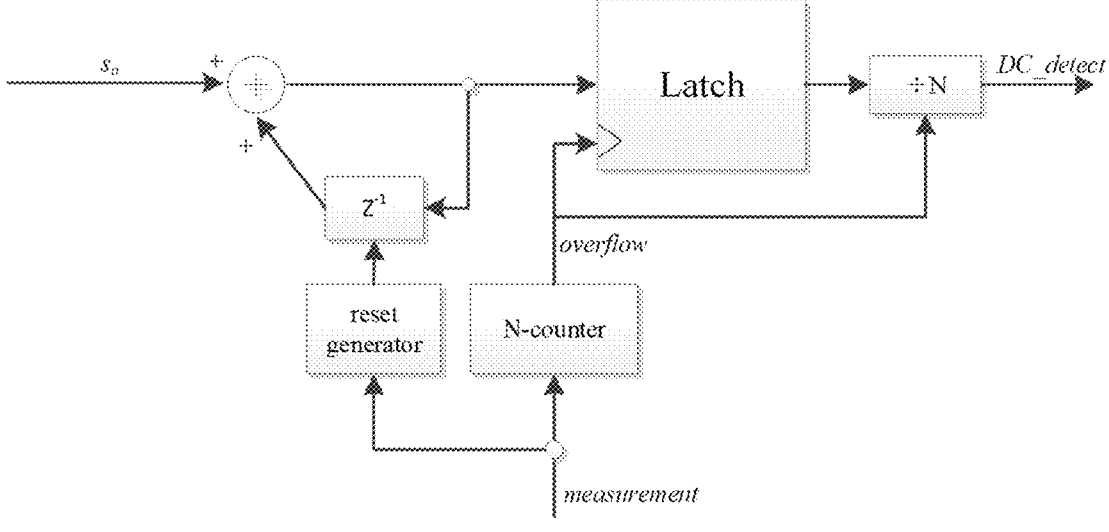
FIG. 3 is another circuit diagram of a DC detection circuit according to exemplary embodiments of the present disclosure.

The DC detection circuit shown in FIG. 2 supports real-time DC offset value detection. However, in actual circuits, N is usually large and more circuit resources are consumed. In order to overcome the problem of excessive consumption of hardware resources, in some exemplary embodiments, a DC detection circuit as shown in FIG. 3 is used for DC detection. In some exemplary embodiments, the DC detection circuit includes a reset circuit generating sub-circuit, a frequency division sub-circuit, an accumulator sub-circuit, a latch sub-circuit, and a divider sub-circuit.

In some exemplary embodiments, the reset circuit generating sub-circuit is configured to receive a detection control signal and generate a reset control signal according to the detection control signal.

In some exemplary embodiments, the frequency division sub-circuit is configured to receive the detection control signal and generate a high pulse signal according to the detection control signal.

In some exemplary embodiments, the accumulator sub-circuit is configured to receive the reset control signal and a second output signal, perform accumulation processing, and generate an accumulation signal.

In some exemplary embodiments, the latch sub-circuit is configured to receive the high pulse signal and latch the accumulation signal based on the high pulse signal.

In some exemplary embodiments, the divider sub-circuit is configured to receive the high pulse signal and an output of the latch sub-circuit and perform a division operation to obtain a detection result.

In some exemplary embodiments, the accumulator sub-circuit shown in FIG. 2 is used as the accumulator sub-circuit in these embodiments. In FIG. 3, the accumulator sub-circuit includes an adder element and a unit delay element. The adder element includes a first input terminal and a second input terminal. The first input terminal is connected to the output terminal of the analog-to-digital conversion circuit, and the second input terminal is connected to the output terminal of the unit delay element. The output terminal of the adder element is connected to the input terminal of the unit delay element.

The input signal $s_o$ with an offset value is input to the accumulator sub-circuit for accumulation. The output of the accumulator sub-circuit is used as the data input of the latch sub-circuit (Latch). The output of the latch sub-circuit is sent to the divider sub-circuit where a division operation is performed. Another input signal of the DC detection circuit is the detection control signal measurement, which serves as an enabling terminal of the reset circuit generating sub-circuit (reset generator) and the frequency division sub-circuit (N-counter). The output of the reset circuit generating sub-circuit is connected to a reset control terminal of the accumulator sub-circuit. The output of the frequency division sub-circuit is used as the clock of the latch sub-circuit and the control signal of the divider sub-circuit. When the detection control signal measurement is high, the reset signal clears the accumulator sub-circuit. At the same time, the counter starts counting, and the accumulator sub-circuit accumulates the input signal. When the counter overflows, a high pulse signal overflow is generated. The high pulse signal overflow latches the accumulated value of the current accumulator sub-circuit. At the same time, the high pulse signal overflow serves as an enable signal of the divider sub-signal and is divided by N, so as to obtain the detection result DC_detect of the DC offset signal. This DC detection circuit outputs a check value every N clock cycles, and the hardware overhead is relatively small during implementation.

Figure 4:
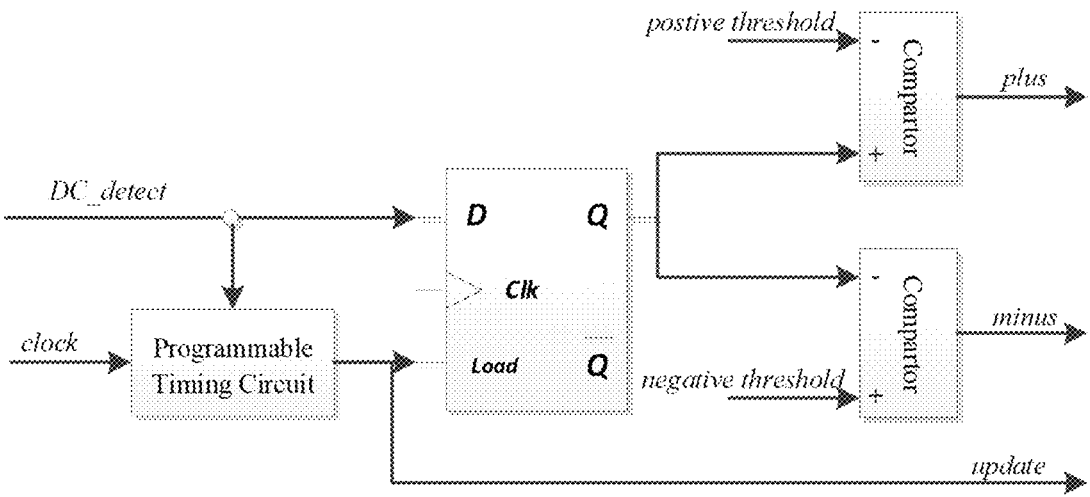
FIG. 4 is a circuit diagram of an adaptive update signal generating circuit according to exemplary embodiments of the present disclosure.

In order to overcome the influence of the online correction process on the normal signal path, embodiments of the present disclosure propose a novel adaptive update signal generating circuit, as shown in FIG. 4. The update control signal includes a first control signal, a second control signal, and a third control signal.

The adaptive update signal generating circuit adaptively generates a correction control signal so that the correction circuit can not only achieve fast convergence of real-time correction but also reduce the influence on the main signal path. The generation of the update control signal by the adaptive update signal generating circuit needs to meet two conditions at the same time: one condition is that the update time is reached, and the other condition is that the detected DC output exceeds the set threshold. The set threshold can be adjusted according to system requirements. When these two conditions are satisfied at the same time, the signal of indication for update, i.e., update control signal is output. According to the above-mentioned conditions, an adaptive update signal generating circuit as shown in FIG. 4 is proposed.

As shown in FIG. 4, the adaptive update signal generating circuit includes a programmable timing sub-circuit, a latch sub-circuit with a setting function, and a comparator sub-circuit.

In some exemplary embodiments, the programmable timing sub-circuit is configured to generate a first control signal when timing exceeds a set threshold.

In some exemplary embodiments, the latch sub-circuit with a setting function is configured to receive the first control signal and latch a detection result according to the first control signal.

In some exemplary embodiments, the comparator sub-circuit is configured to receive the detection result and compare the detection result with a set threshold to generate a second control signal and a third control signal.

When the timing exceeds the set threshold, a programmable timing sub-circuit (Programmable Timing Circuit) generates a high pulse update, i.e., the first control signal under the action of the clock clock. The first control signal latches the DC value detected by the previous stage to the sub-circuit. The comparator sub-circuit compares the latched DC value with a high threshold and a low threshold. When the detected DC value is higher than the high threshold positive threshold, the second control signal plus is output. When the detected DC value is lower than the low threshold negative threshold, the third control signal minus is output.

The programmable timing sub-circuit uses the detection result DC_detect as a timing preset value. When the absolute value of the detection result DC_detect is large, that is, exceeds a certain value, the frequency division ratio of the programmable timing sub-circuit is small, and the first control signal update can be generated in a relatively short time. When the absolute value of the detection result DC_detect is small, that is, less than a certain value, the frequency division ratio of the programmable timing sub-circuit is large, and a timing signal can be generated in a relatively long time. Therefore, by adopting this mechanism, the refresh adjustment rate can be adaptively adjusted dynamically according to the detected DC offset value. In this way, DC correction can be performed quickly and high correction accuracy can be obtained.

Figure 5:
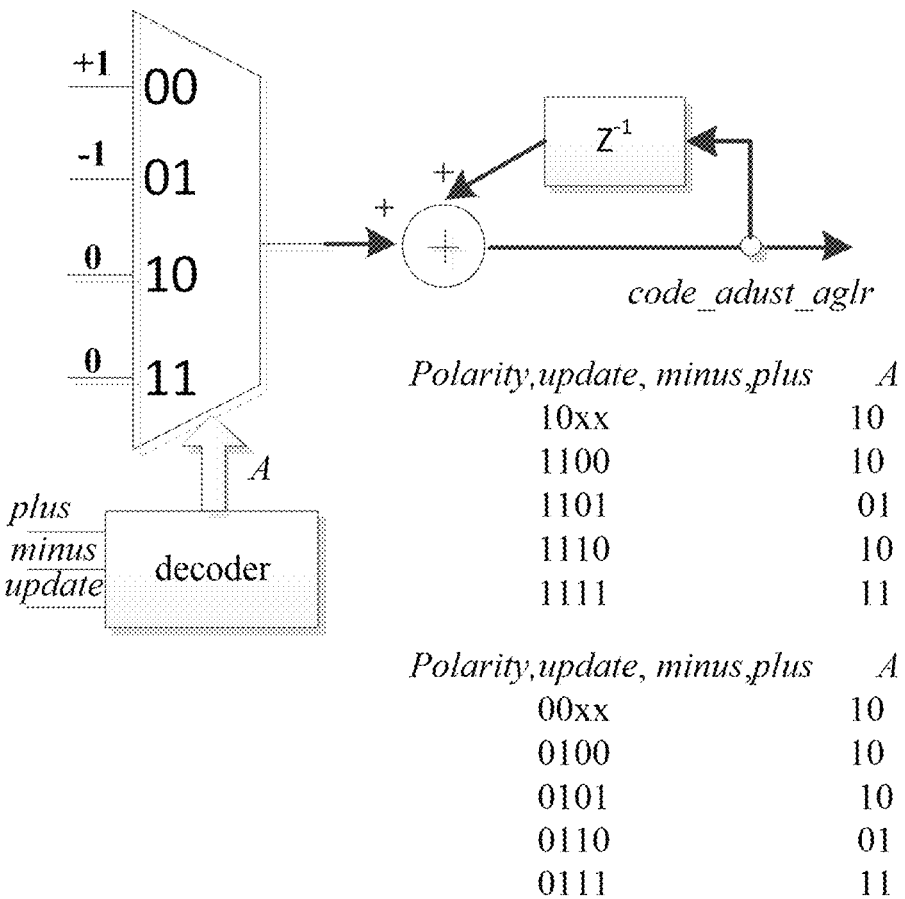
FIG. 5 is a circuit diagram of an output circuit according to exemplary embodiments of the present disclosure.

The second control signal plus, the third control signal minus, and the first control signal update generated by the adaptive update signal generating circuit are sent to the output circuit to control the output of the output circuit. The output circuit is shown in FIG. 5.

The output circuit includes a decoder sub-circuit, a selection sub-circuit, and an accumulator sub-circuit.

In some exemplary embodiments, the decoder sub-circuit is configured to receive an update control signal and generate a selection control signal according to the update control signal.

In some exemplary embodiments, the selection sub-circuit is configured to receive the selection control signal and generate a selection signal according to the selection control signal.

In some exemplary embodiments, the accumulator sub-circuit is configured to accumulate the selection signal to generate a first mode selection signal.

The input terminal of the decoder sub-circuit is the output of the adaptive update signal generating circuit, and its decoding truth table is shown in FIG. 5. The output of the decoder sub-circuit (decoder) controls the selection sub-circuit. When the output of the decoder sub-circuit is 00, the output of the selection sub-circuit is 1; when the output of the decoder sub-circuit is 01, the output of the selection sub-circuit is −1; when the output of the decoder sub-circuit is 10 and 11, the output of the selection sub-circuit is 0. The output of the selection sub-circuit is used as the input of the accumulator sub-circuit for accumulation. The output of the accumulator sub-circuit is sent to a mode selection circuit as an output code of the correction algorithm.

In order to increase the flexibility and configurability of the circuit for DC offset correction, a mode selection circuit is added before the DAC. The mode selection circuit has two input terminals, where an input terminal, that is, a first mode selection signal code_adust_aglr is connected to the output circuit, and the other input terminal is connected to an offset correction code input by the system, that is, a second mode selection signal code_adust_sys. When the system adopts online automatic calibration, the mode selection circuit sends the output result of online calibration, that is, the calibration signal, to the DAC. When the system adopts direct configuration, the mode selection circuit sends the output result of system configuration to DAC. The DAC converts a digital signal into an analog adjustment quantity. The analog adjustment quantity is added to a main signal through the analog adder circuit, thereby eliminating the offset value in the main signal.

A circuit for online adaptive DC offset correction used in a wireless receiver proposed by embodiments of the present disclosure can automatically detect the magnitude of the DC offset value in the input signal, and adaptively compensate the DC offset value, thereby eliminating the impact of the DC offset on the performance of the receiver.

Embodiments of the present application also provide a zero-IF receiver, which includes a circuit for online adaptive DC offset correction as shown in FIG. 1.

Those skilled in the art can appreciate that the units and algorithm steps of the examples described in conjunction with the embodiments disclosed herein can be implemented by electronic hardware or a combination of computer software and electronic hardware. Whether these functions are executed by hardware or software depends on the specific application and design constraints of the technical solution. The skilled in the art may use different methods to implement the described functions for each specific application, but such implementation should not be regarded as exceeding the scope of the present application.

Those skilled in the art can clearly understand that for the convenience and brevity of the description, the specific working process of the above-described system, device, unit, and element can refer to the corresponding process in the foregoing method embodiment, which will not be repeated here.

The units described as separate components may or may not be physically separated, and the components shown as units may or may not be physical units, that is, they may be located in one place or may be distributed to multiple network units. Part or all of the units can be selected according to actual needs to achieve the purpose of the solution of embodiments.

The above-mentioned embodiments only illustrate the principles and effects of the present disclosure but are not intended to limit the present disclosure. Anyone skilled in the art can modify or change the above-mentioned embodiments without departing from the scope of the present disclosure. Therefore, all equivalent modifications or changes made by those skilled in the art without departing from the technical ideas disclosed in the present disclosure should still be covered by the claims of the present disclosure.

What is claimed is:

1. A circuit for online adaptive DC offset correction, applied to a zero-IF receiver, comprising:
an analog adder circuit configured to receive a first input signal generated by the zero-IF receiver and a second input signal generated by a digital-to-analog conversion circuit, and generate a first output signal according to the first input signal and the second input signal;
an analog-to-digital conversion circuit configured to receive the first output signal and perform analog-to-digital conversion on the first output signal to obtain a second output signal;
a DC detection circuit configured to perform DC detection on the second output signal under a control of a detection control signal generated by an adaptive update signal generating circuit to generate a detection result, and the DC detection circuit comprising:
a delay sub-circuit configured to receive the second output signal and perform delay processing on the second output signal to generate a delayed signal;
a digital adder sub-circuit configured to receive the delay signal and perform an addition operation on the second output signal and an output signal of the delay sub-circuit to generate an addition signal;
a divider sub-circuit configured to receive the addition signal and perform division operation on the addition signal; and
an accumulator sub-circuit configured to receive the division signal and the update control signal and generate a detection result according to the division signal and the update control signal;
the adaptive update signal generating circuit configured to receive the detection result and generate an update control signal according to the detection result;
an output circuit configured to receive the update control signal and generate a first mode selection signal according to the update control signal; and
a mode selection circuit configured to receive the first mode selection signal and generate a correction signal according to the first mode selection signal and a second mode selection signal, wherein the correction signal is used as an input signal of the digital-to-analog conversion circuit.

2. The circuit according to claim 1, wherein the delay sub-circuit includes a plurality of delay elements connected in sequence.

3. The circuit according to claim 1, wherein
the accumulator sub-circuit includes an adder element and a unit delay element,
the adder element includes a first input terminal and a second input terminal,
the first input terminal is connected to an output terminal of the divider sub-circuit,
the second input terminal is connected to an output terminal of the unit delay element, and
an output terminal of the adder element is connected to an input of the unit delay element.

4. The circuit according to claim 1, wherein the update control signal includes a first control signal, a second control signal, and a third control signal, and wherein the adaptive update signal generating circuit includes:
a programmable timing sub-circuit configured to generate the first control signal when timing exceeds a set threshold;
a latch sub-circuit with a setting function configured to receive the first control signal and latch the detection result according to the first control signal; and
a comparator sub-circuit configured to receive the detection result and compare the detection result with a set threshold to generate the second control signal and the third control signal.

5. The circuit according to claim 4, wherein the comparator sub-circuit is configured to generate the second control signal upon determining that the detection result exceeds a high threshold value and generate the third control signal upon determining that the detection result is lower than a low threshold value.

6. The circuit according to claim 1, wherein the output circuit includes:
a decoder sub-circuit configured to receive the update control signal and generate a selection control signal according to the update control signal;
a selection sub-circuit configured to receive the selection control signal and generate a selection signal according to the selection control signal; and
an accumulator sub-circuit configured to accumulate the selection signal to generate the first mode selection signal.

7. The circuit according to claim 6, wherein
the accumulator sub-circuit includes an adder element and a unit delay element,
the adder element includes a first input terminal and a second input terminal,
the first input terminal is connected to an output terminal of the selection sub-circuit,
the second input terminal is connected to an output terminal of the unit delay element, and
an output terminal of the adder element is connected to an input terminal of the unit delay element.

8. A zero-IF receiver, comprising a circuit for online adaptive DC offset correction, wherein the circuit includes:
an analog adder circuit configured to receive a first input signal generated by the zero-IF receiver and a second input signal generated by a digital-to-analog conversion circuit, and generate a first output signal according to the first input signal and the second input signal;

an analog-to-digital conversion circuit configured to receive the first output signal and perform analog-to-digital conversion on the first output signal to obtain a second output signal;

a DC detection circuit configured to perform DC detection on the second output signal under a control of a detection control signal generated by an adaptive update signal generating circuit to generate a detection result, and comprising:

a delay sub-circuit configured to receive the second output signal and perform delay processing on the second output signal to generate a delayed signal;

a digital adder sub-circuit configured to receive the delay signal and perform an addition operation on the second output signal and an output signal of the delay sub-circuit to generate an addition signal;

a divider sub-circuit configured to receive the addition signal and perform division operation on the addition signal; and an accumulator sub-circuit configured to receive the division signal and the update control signal and generate a detection result according to the division signal and the update control signal;

the adaptive update signal generating circuit configured to receive the detection result and generate an update control signal according to the detection result;

an output circuit configured to receive the update control signal and generate a first mode selection signal according to the update control signal; and a mode selection circuit configured to receive the first mode selection signal and generate a correction signal according to the first mode selection signal and a second mode selection signal, wherein the correction signal is used as an input signal of the digital-to-analog conversion circuit.

9. The zero-IF receiver according to claim 8, wherein the delay sub-circuit includes a plurality of delay elements connected in sequence.

10. The zero-IF receiver according to claim 8, wherein the accumulator sub-circuit includes an adder element and a unit delay element, the adder element includes a first input terminal and a second input terminal, the first input terminal is connected to an output terminal of the divider sub-circuit, the second input terminal is connected to an output terminal of the unit delay element, and an output terminal of the adder element is connected to an input of the unit delay element.

11. The zero-IF receiver according to claim 8, wherein the update control signal includes a first control signal, a second control signal, and a third control signal, and wherein the adaptive update signal generating circuit includes:

a programmable timing sub-circuit configured to generate the first control signal when timing exceeds a set threshold;

a latch sub-circuit with a setting function configured to receive the first control signal and latch the detection result according to the first control signal; and a comparator sub-circuit configured to receive the detection result and compare the detection result with a set threshold to generate the second control signal and the third control signal.

12. The zero-IF receiver according to claim 11, wherein the comparator sub-circuit is configured to generate the second control signal upon determining that the detection result exceeds a high threshold value and generate the third control signal upon determining that the detection result is lower than a low threshold value.

13. The zero-IF receiver according to claim 8, wherein the output circuit includes:

a decoder sub-circuit configured to receive the update control signal and generate a selection control signal according to the update control signal;

a selection sub-circuit configured to receive the selection control signal and generate a selection signal according to the selection control signal; and an accumulator sub-circuit configured to accumulate the selection signal to generate the first mode selection signal.

14. The zero-IF receiver according to claim 13, wherein the accumulator sub-circuit includes an adder element and a unit delay element, the adder element includes a first input terminal and a second input terminal, the first input terminal is connected to an output terminal of the selection sub-circuit, the second input terminal is connected to an output terminal of the unit delay element, and an output terminal of the adder element is connected to an input terminal of the unit delay element.

\* \* \* \* \*